United States Patent [19]

Tobias

[11] 4,017,796
[45] Apr. 12, 1977

[54] ELECTRICAL CIRCUIT MEANS FOR USE IN ANALOGUE DISPLAY AND/OR CONTROL SYSTEMS

[76] Inventor: Martin B. Tobias, 43, Shakespeare Road, St. Ives, Huntingdon PE17 4TT, England

[22] Filed: Jan. 27, 1975

[21] Appl. No.: 544,366

[30] Foreign Application Priority Data

Jan. 29, 1974 United Kingdom .............. 4013/74

[52] U.S. Cl. .............................. 324/122; 324/96; 340/324 R
[51] Int. Cl.$^2$ ................. G01R 19/00; G01R 19/16
[58] Field of Search ........ 324/122, 96, 133, 103 R; 340/324 R, 378; 356/227

[56] References Cited

UNITED STATES PATENTS

| | | | |
|---|---|---|---|
| 2,486,890 | 11/1949 | Stanmyre | 324/103 R |
| 3,796,951 | 3/1974 | Joseph | 324/122 |

Primary Examiner—Rudolph V. Rolinec
Assistant Examiner—Ernest F. Karlsen
Attorney, Agent, or Firm—Browdy and Neimark

[57] ABSTRACT

Analogue display apparatus comprising a chain of light emitting diodes (LED's) connected in series with a constant current source, there being respective transistor switches connected between one side of each LED and a reference voltage source unique to that LED. If a common analogue voltage which is applied to all the transistors exceeds a particular reference voltage, the associated transistor will turn on and will divert current away from the corresponding LED. The number of LED's that are illuminated is thereby indicative of the magnitude of the analogue voltage. Optionally, the LED's control photo-transistors which operate feedback or alarm systems.

14 Claims, 8 Drawing Figures

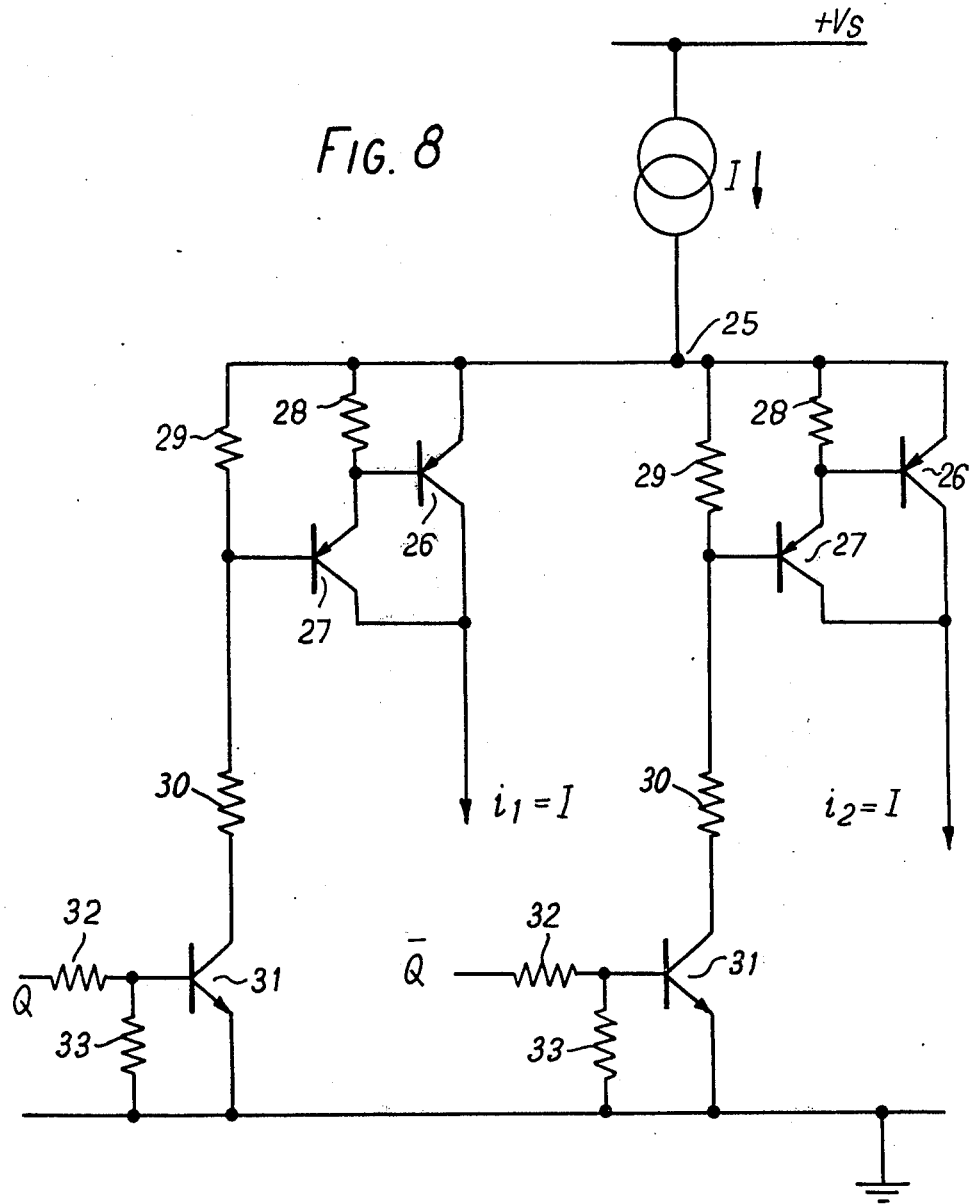

ELECTRICAL CIRCUIT MEANS FOR USE IN ANALOGUE DISPLAY AND/OR CONTROL SYSTEMS

BACKGROUND OF THE INVENTION

This invention relates to electrical circuit means for use in analogue display and/or control systems.

It is well known that an array of light emitting diodes (hereinafter referred to as "LED") can be used to provide a visual indication of the magnitude of an electrical parameter, typically voltage. The number, or position within the array, of LED's that emit is determined by the magnitude of the input voltage.

Hitherto such analogue display systems have used digital logic circuitry (such as shift-register, counter, or decoder networks) to turn the individual LED's on and off, with an analogue-to-digital convertor circuit to interface with the analogue voltage input.

This method is needlessly complex since both input and output are analogue, whilst the signal processing in between is digital. This complexity leads to high costs.

SUMMARY OF THE INVENTION

It is an object of this invention to provide improved circuits for use in analogue display and/or control systems, which do not suffer from the above disadvantages.

The present invention consists in electrical circuit means comprising a plurality of radiation emitting diodes connected in electrical relationship for the passage of electrical current successively therethrough, means for connecting the radiation emitting diodes in series with a source of a direct constant current, current diverting paths respectively connected with the radiation emitting diodes, a semiconductor device disposed in each current diverting path, means for applying a control voltage in the form of an analogue input voltage to the semiconductor devices, and means independent of the radiation emitting diodes for biasing each semiconductor device to effect conduction of the current diverting path associated therewith at a predetermined level of the analogue input voltage said predetermined level being unique to each path and increasing succesively from one to the next path.

In one form of the invention there is provided a plurality of arrays of radiation emitting diodes the diodes of each array being connected in electrical relationship for the passage of electrical current successively therethrough, means for connecting the arrays each in series with a source of direct constant current, current diverting paths respectively connected with each set of radiation emitting diodes said set being formed by corresponding diodes of the arrays, a semiconductor device disposed in each current diverting path, means for applying in turn analogue input voltages corresponding in number to the number of diode arrays to the semiconductor devices, means for biasing each semiconductor device to effect conduction of the current diverting path associated therewith at a predetermined level of the analogue input voltages, said predetermined level being unique to each path and increasing successively from one to the next path, and means for energising the diode arrays in turn from a source of direct constant current in synchronism with the application of the analogue voltage inputs to the semiconductor devices.

BRIEF DESCRIPTION OF THE DRAWINGS

The invention will now be described, by way of example, with reference to the accompanying drawings, in which:

FIGS. 7 and 8 illustrate alternative current sources for the circuit of FIG. 6.

Throughout the drawings like parts are accorded the same reference symbols.

DETAILED DESCRIPTION OF THE PREFERRED EMBODIMENTS

Figure 1:
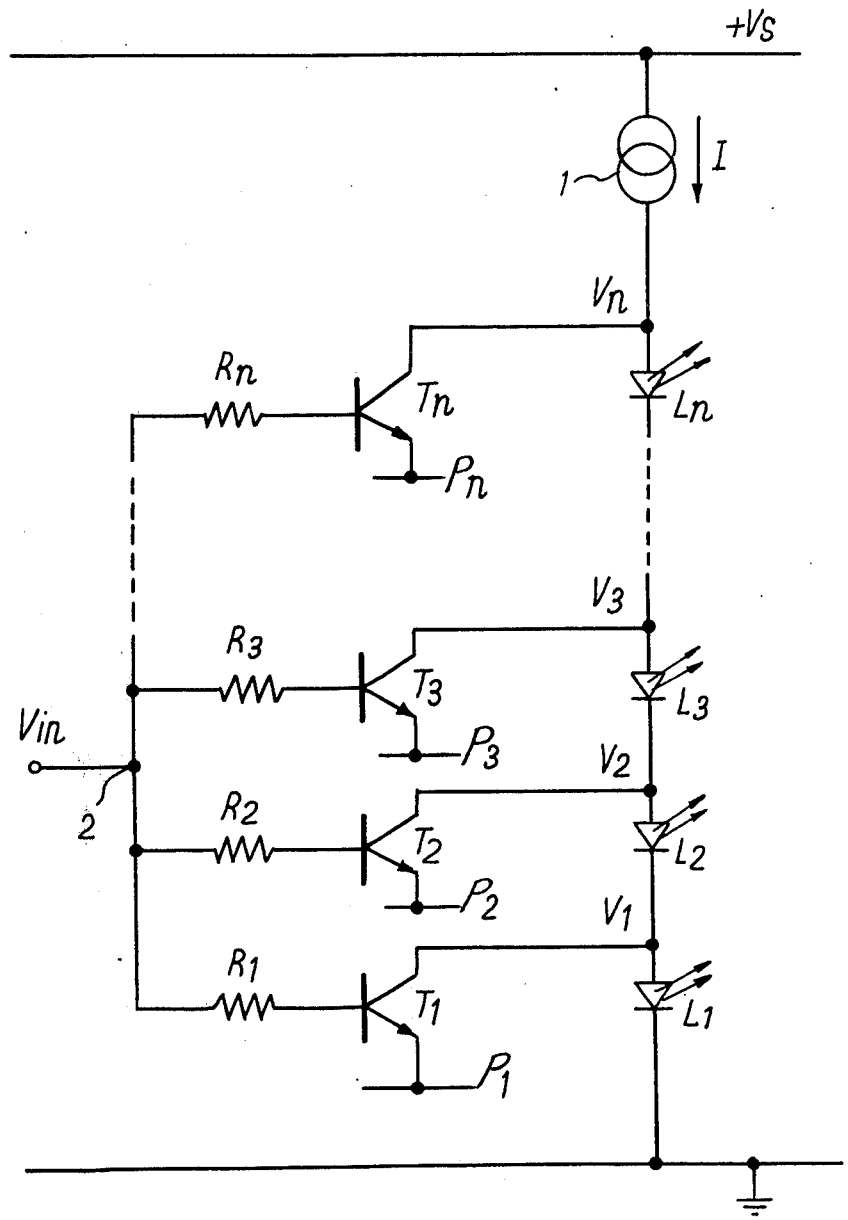
FIG. 1 is a diagram illustrating in general form the circuit of the invention.

Referring first to FIG. 1, light emitting diodes $L_1 L_2 L_3 \ldots L_n$ are connected in series so that electrical current I may pass through them successively from $L_n$ to $L_1$. The cathode of $L_1$ is connected to earth and the anode of $L_n$ is connected to one terminal of a source of constant direct current 1 the other terminal of which is connected to the positive supply rail at a voltage $V_s$. The collectors of a plurality of NPN transistors $T_1 T_2 T_3 \ldots T_n$ are respectively connected to the anodes of LED's $L_1 L_2 L_3 \ldots L_n$. The emitter of transistor $T_i$, where $i$ is any integer from 1 to $n$, is held at a reference voltage $p_i$, the magnitude of this reference voltage increases successively from $p_1$ to $p_n$, that is:

$$p_1 < p_2 < p_3 \ldots < p_n \tag{a}$$

The base of transistor $T_1$ is connected through a resistor $R_i$ (N.B. $i$ being as previously stated any integer from 1 to $n$) to a common input terminal 2. The transistors thus lie in current diverting paths connected with the anodes of the respective LED's.

The current source will produce a constant current I provided only that the supply voltage $V_s$ is sufficiently positive for the source to function when all the transistors are off and this current I is flowing through each of the LED's in turn. There is no necessity for $V_s$ to be either regulated or ripple free. A voltage difference appears across each LED (defining the voltage at the anode of LED $L_i$ as $V_i$, that difference is given by $V_i(T_i$ off$) - V_{i-1}(T_{i-1}$ off$)$ ) which is required to be greater than the threshold voltage for visible light emission from the LED, that voltage being, say, $u_i$, i.e., $$V_i(T_i \text{ off}) - V_{i-1}(T_{i-1} \text{ off}) > u_i \tag{b}$$

No two LED's have identical parameters and they will in particular have slightly different values of $u_i$. In order to simplify the subsequent analysis, however, the various $u_i$ will be taken to be equal to a fixed value $u$ and in practice the use of matched components would enable this to be closely approximated.

Figure 5:
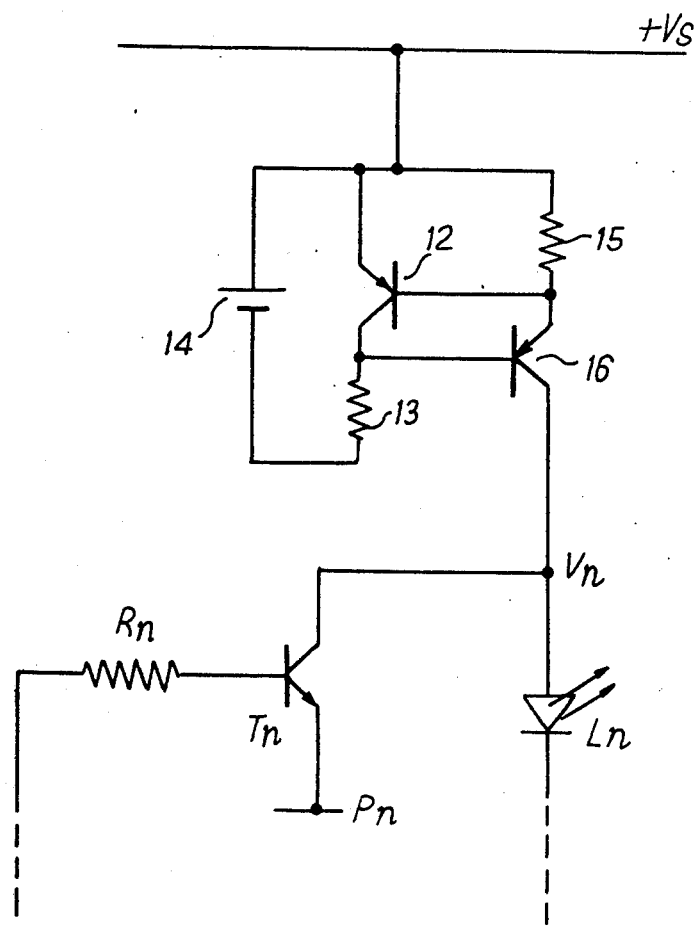
FIG. 5 illustrates a current source suitable for the circuits of the preceding figures.

A suitable form of current source is illustrated in FIG. 5. PNP transistor 12 has its emitter connected to the positive supply rail and its collector connected through a resistor 13 to the negative terminal of a battery 14. The positive terminal of the battery is connected to the supply rail. The base of transistor 12 is connected to the supply rail through a resistor 15 and to the emitter of a second PNP transistor 16. The base of transistor 16 is connected to the collector of transistor 12 and the collector to the anode of the LED $L_n$. The value of resistor 15 is chosen so that I is sufficiently large for each LED to emit visibly when all the transistors are off.

The transistors will, in fact, all be turned off if the voltage at the input terminal $V_{in}$ is below the value required to forward bias the base-emitter junction of $T_1$. That is:

$$V_{in} < p_1 + V_{be} + i_{B1}R_1 \quad (c)$$

If the transistors are of the silicon type $V_{be}(\text{on}) \approx 0.6$ Volts, $i_{B1}$ is the base current of $T_1$ and because the transistor is turned off, it is zero. The condition on $V_{in}$ for $T_1$ to be off becomes:

$$V_{in} < p_1 + 0.6 \quad (d)$$

As we have specified that $p_1 < p_2 < p_3 \ldots p_n$, it follows that the remaining transistors $T_2\ T_3 \ldots T_n$ will also be off.

As $V_{in}$ is increased, transistor $T_1$ will begin to conduct and current will be diverted away from LED $L_1$. Similarly as $V_{in}$ increases further, transistors $T_2 T_3 \ldots T_n$ will begin to conduct in turn and divert current away from their respective LED's.

It will be assumed for the moment that the required mode of operation is for $L_i$ to be completely extinguished before the emission of $L_{i+1}$ begins to diminish. It will later be shown, however, that other modes are possible.

A further criterion that must be satisfied by the reference voltages is that the voltage across LED $L_i$ must be reduced below $u$ by the action of fully turning on $T_i$. By our choice of the above mode of operation, $T_{i-1}$ is fully on at this point, therefore we require that:

$$V_i(T_i \text{ on}) - V_{i-1}(T_{i-1} \text{ on}) < u \quad (e)$$

but $$V_i(T_i \text{ on}) = p_i + V_{CE(SAT)} \quad (f)$$

where $V_{CE(SAT)}$ is the collector emitter voltage of a saturated transistor, and is taken to be the same for all transistors.

∴ (e) can be written $$p_i - p_{i-1} < u \text{ for } i \neq 1 \quad (g)$$

and $$p_1 + V_{CE(SAT)} < u \quad (h)$$

Successive reference voltages must differ by less than the threshold voltage $u$, if the transistor is to be able to turn off its associated LED. In addition, of course, the transistor must be capable of carrying the current I.

Over the range of input voltages:

$$p_1 + 0.6 + i_{B1}R_1 < V_{in} < p_2 + 0.6 \quad (i)$$

$L_1$ will be the only LED which is not fully on. The value of $V_{in}$ at which $L_1$ is completely turned off will be determined by the value of $R_1$ and by the current gain of transistor $T_1$. To obtain the mode of operation previously outlined, this voltage must be less than $p_2 + 0.6$.

It will be seen that as $V_{in}$ increases the individual transistors pass through their amplifying regions successively, in so doing they diminish and finally extinguish the light emission from their respective LED's. Hence the number of LED's which emit is governed by the value of $V_{in}$. If, for example, the LED's are arranged in the form of a column, the height of the illuminated portion of the column will decrease as $V_{in}$ increases. The reverse effect can be achieved by placing an inverting amplifier in the circuit, between the external source of analogue voltage and the input terminal of the circuit. The height of the illuminated portion of the column will then increase with the analogue voltage.

It will now be understood that the separation or indeed overlap of the ranges of input voltage over which successive LED's are turned off can be controlled by a suitable choice of transistor $T_i$ and resistor $R_i$. If the input voltage required to extinguish $L_i$ is so arranged to be $V_{in} = A_i$, the following situations can be distinguished.

$$A_i < p_{i+1} + 0.6 \quad (j)$$

$$A_i \approx p_{i+1} + 0.6 + i_{Bi+1} R_{i+1} \quad (k)$$

$$A_i > p_{i+1} + 0.6 + i_{Bi+1} R_{i+1} \quad (l)$$

The value of $i_{Bi+1}$ in statements (k) and (l) will be different since $i_B$ is a function of $V_{in}$.

Inequality (j) leads to the mode of operation discussed so far, that is $L_i$ is turned off before transistor $T_{i+1}$ begins to conduct. The input voltage interval between the turning off of $L_i$ and the initial reduction in intensity of $L_{i+1}$ — the so called "dead band" — is determined by the degree of this inequality. In this situation, no more than two of the current diverting paths are conducting a significant current, at any value of the input voltage.

The approximate equality (k) will result in at least one LED being in a transitionary state at any value of the input voltage, hence zero "dead-band."

Inequality (l) will lead to two or more LED's being in a transitionary state at any value of the input voltage. The visual effect will be a gradual change in intensity along the array as $V_{in}$ is altered. At certain values of the input voltage, three or more of the current diverting paths are conducting a significant current.

Those later two modes impose no stricter conditions on the reference voltages than (g) and (h).

Providing they satisfy inequalities (a), (g) and (h), the reference voltages are arbitrary though for many purposes it is convenient to have them approximately equispaced, to obtain an approximately linear input-/output characteristic.

Figure 2:
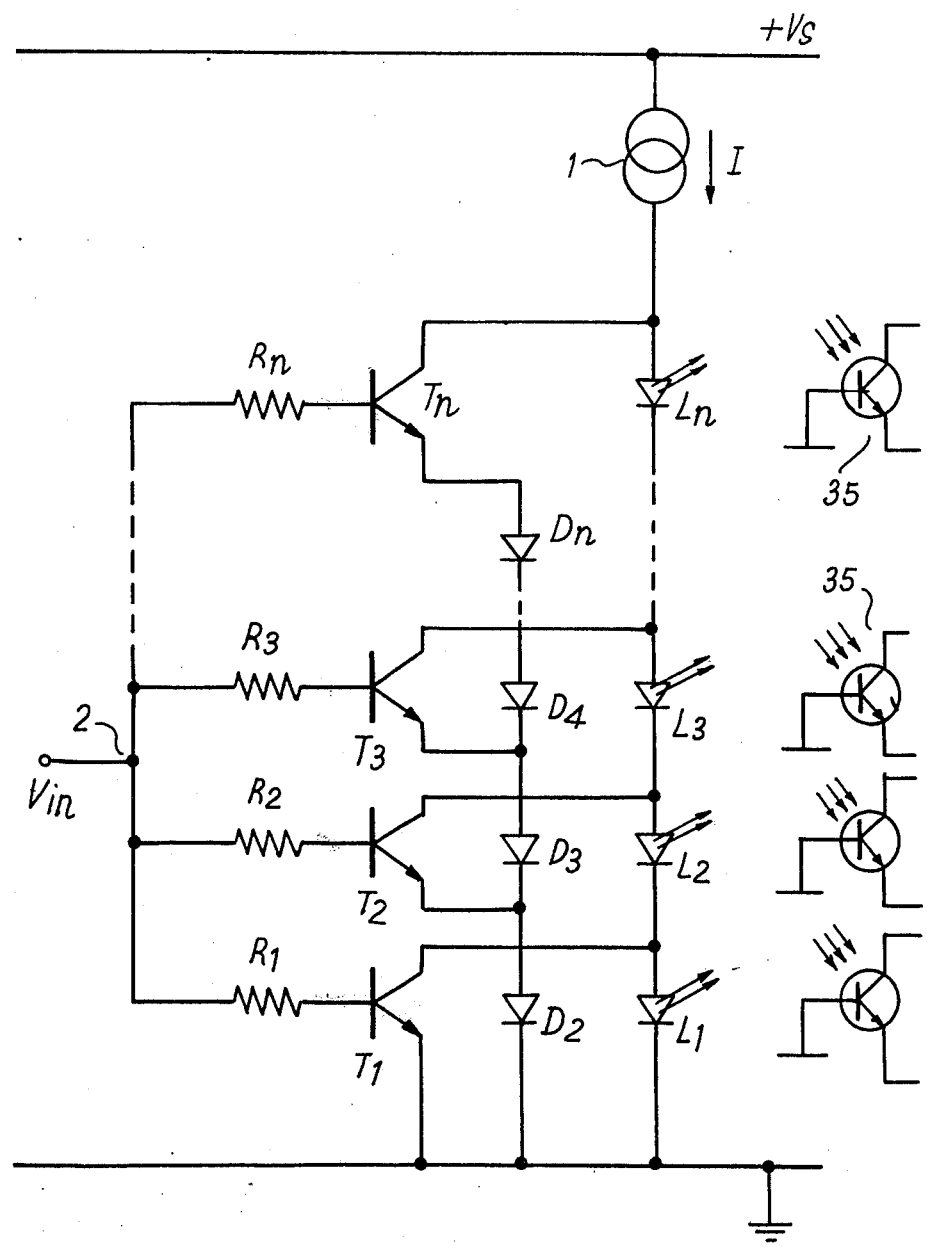
FIG. 2 illustrates a more specific form of the circuit of FIG. 1.

The reference voltages can conveniently be supplied by a chain of silicon diodes as shown in FIG. 2. The anode and cathode of diode $D_i$ are connected to the emitters of transistors $T_i$ and $T_{i-1}$ respectively. The value of reference voltage $p_1$ has been chosen to be zero so that the emitter of $T_1$ is taken directly to earth and no corresponding diode is required.

This method of creating the referrence voltages has the particular advantages of first low cost and second that none of the base-emitter junctions of transistors $T_2$, $T_3 - T_n$ and indeed $T_1$ providing $V_{in}$ remains positive, ever becomes reverse biased no matter how large $n$ may be; there is consequently no need to provide protection against reverse breakdown of these junctions.

In certain circumstances other methods, in place of diodes $D_i$, of providing reference voltages, such as zener diodes or transistors having their base and collector externally coupled, may be appropriate. The advantage of the latter device is that the voltage drop across it is more stable with respect to current than is the case with an ordinary silicon diode.

If desired the NPN transistors $T_1 - T_n$ may be replaced by other suitable semiconductor devices, for example compound transistor arrangements, MOS transistors, junction FET's and S.C.R's.

Figure 3:
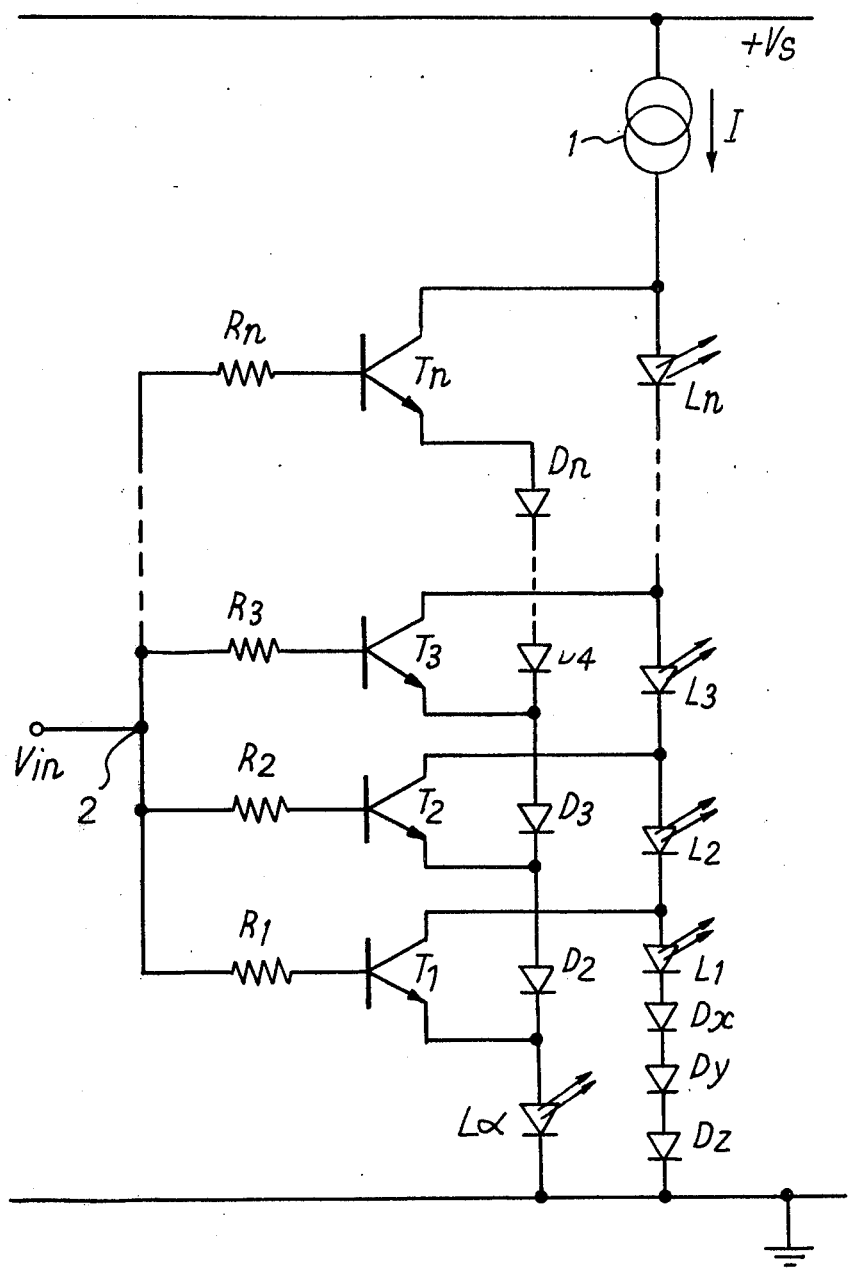
FIGS. 3 and 4 illustrate modifications of the circuit of FIG. 2.
Figure 4:
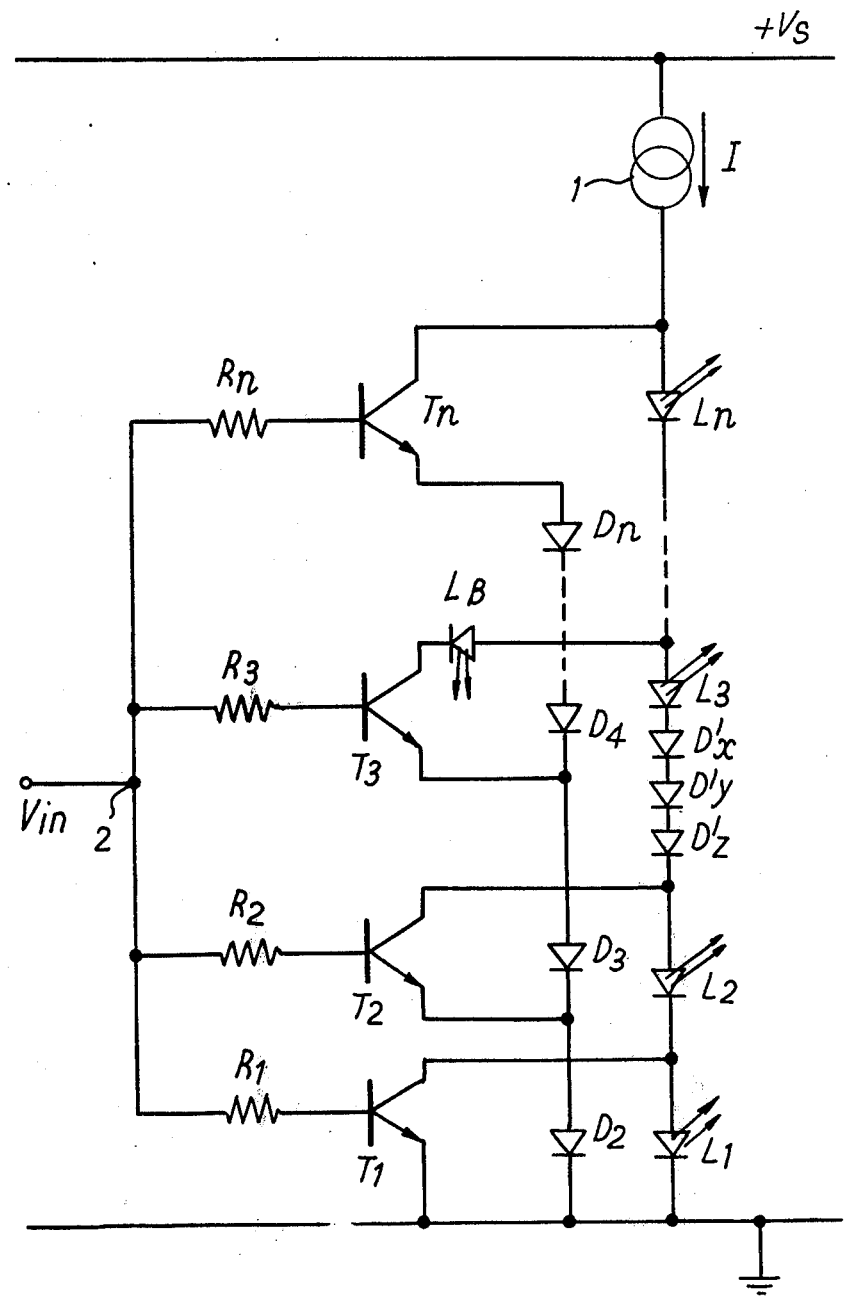

Further features of the invention are shown in FIGS. 3 and 4. If desired, the current diverted away from a particular LED in order to turn it off, may be routed into an additional LED so turning it on. In FIG. 3, a LED $L_\alpha$ is inserted in the circuit of FIG. 2 with its anode connected to the junction of the emitter of transistor $T_1$ and the cathode of diode $D_2$ and its cathode connected to earth. In this position $L_\alpha$ will emit when one or more of LED's $L_1 - L_n$ are turned off; it can thus be used to indicate when the top of a scale is reached.

$L_\alpha$ will supply transistor $T_1$ with a reference voltage $p_1$ which might not necessarily fulfil inequality (h). Accordingly it may be necessary to raise $V_1$ with, for example, the addition of diodes $D_x$, $D_y$ and $D_z$ in series with $L_1$ or to connect the cathode of $L_\alpha$ to a negative supply so reducing $p_1$. Any or all of the reference diodes could be replaced by LED's providing that appropriate steps are taken to satisfy inequality (g).

An alternative position for an additional LED is illustrated in FIG. 4. An LED $L_\beta$ has its anode connected to the anode of LED $L_3$ and its cathode connected to the collector of the associated transistor $T_3$. As before, additional dioes $D_x'$, $D_y'$, $D_z'$ may be required in series with $L_3$.

Led $L_\beta$ will emit only when transistor $T_3$ is diverting current from $L_3$. It will therefore emit only over a limited range of input voltages. This behaviour has useful applications, as, for example, as indication that the parameter which $V_{in}$ represents lies within the predetermined tolerances of a required value.

If desired, the constant current I from the source may be chopped, keeping the mean current constant. This has the known effect of increasing the intensity of emission from certain types of LED's. The circuit illustrated in FIG. 8 is suitable for this purpose. If a square wave is applied at Q, the current $i_1$ will be a chopped form of the constant current I. This current $i_1$ could be supplied to the anode of $L_n$ in any of the circuits shown in FIGS. 1, 2, 3, and 4.

If a number of analogue inputs are to be displayed on respective LED arrays it may be possible to reduce the total number of electrical components required and hence usually the cost, by utilizing multiplexing techniques. A plurality of LED arrays are controlled by one set of transistors $T_1 - T_n$, resistors $R_1 - R_n$ and diodes $D_2 - D_n$. Each array is selected in turn, current then being supplied to it while the corresponding analogue input is connected to the input terminal.

Figure 6:
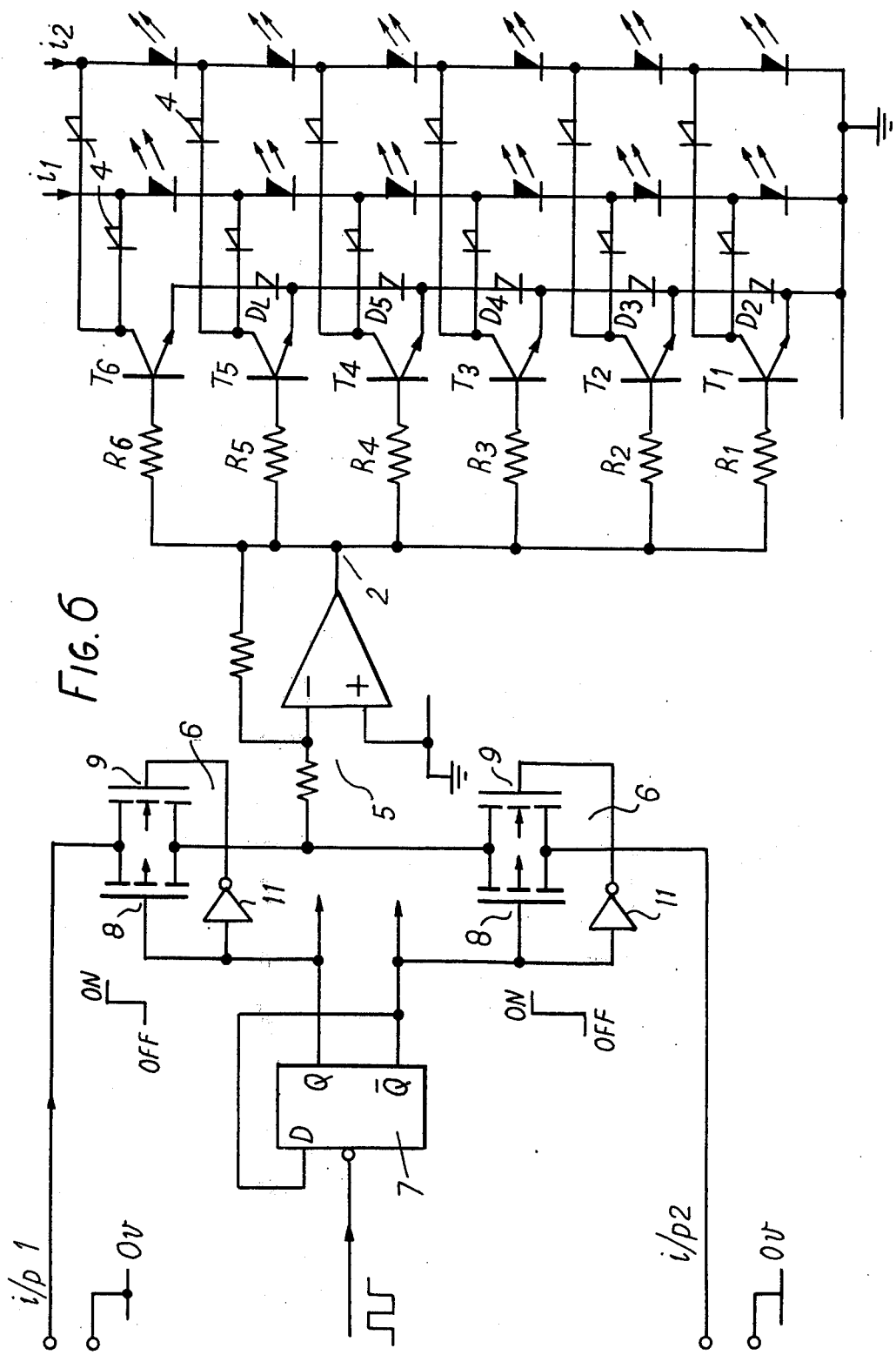
FIG. 6 illustrates a further embodiment.

Suitable multiplexing circuitry is illustrated in FIG. 6; here, for ease of description and illustration, only two arrays of LED's are multiplexed.

As in FIG. 2, transistors $T_1 - T_n$ are provided with corresponding resistors $R_1 - R_n$ and diodes $D_2 - D_n$. The anode of each of the LED's is connected to the anode of an isolating diode 4, the cathode of which is connected to the collector of the corresponding transistor $T_i$.

An inverting amplifier 5 has its output connected to the input terminal 2 for the purpose hereinbefore described.

The two analogue inputs i/p 1 and i/p 2 are connected to the input of the inverting amplifier 5 through respective transmission gates 6. The transmission gates are controlled by a D-type bistable flip-flop 7 which has its $\bar{Q}$ output connected to the D input and is supplied with a square wave input. This device functions as a "divide-by-two" counter. The outputs Q and $\bar{Q}$ are fed to first control inputs 8 of the respective transmission gates 6, the first control input of each transmission gate being connected through an inverter 11 to the second control input 9 of the same gate.

The two transmission gates are thus opened and closed alternately and the two analogue inputs are alternately applied to the input of the amplifier. If desired the transmission gates could be replaced by other forms of analogue switches.

Figure 7:
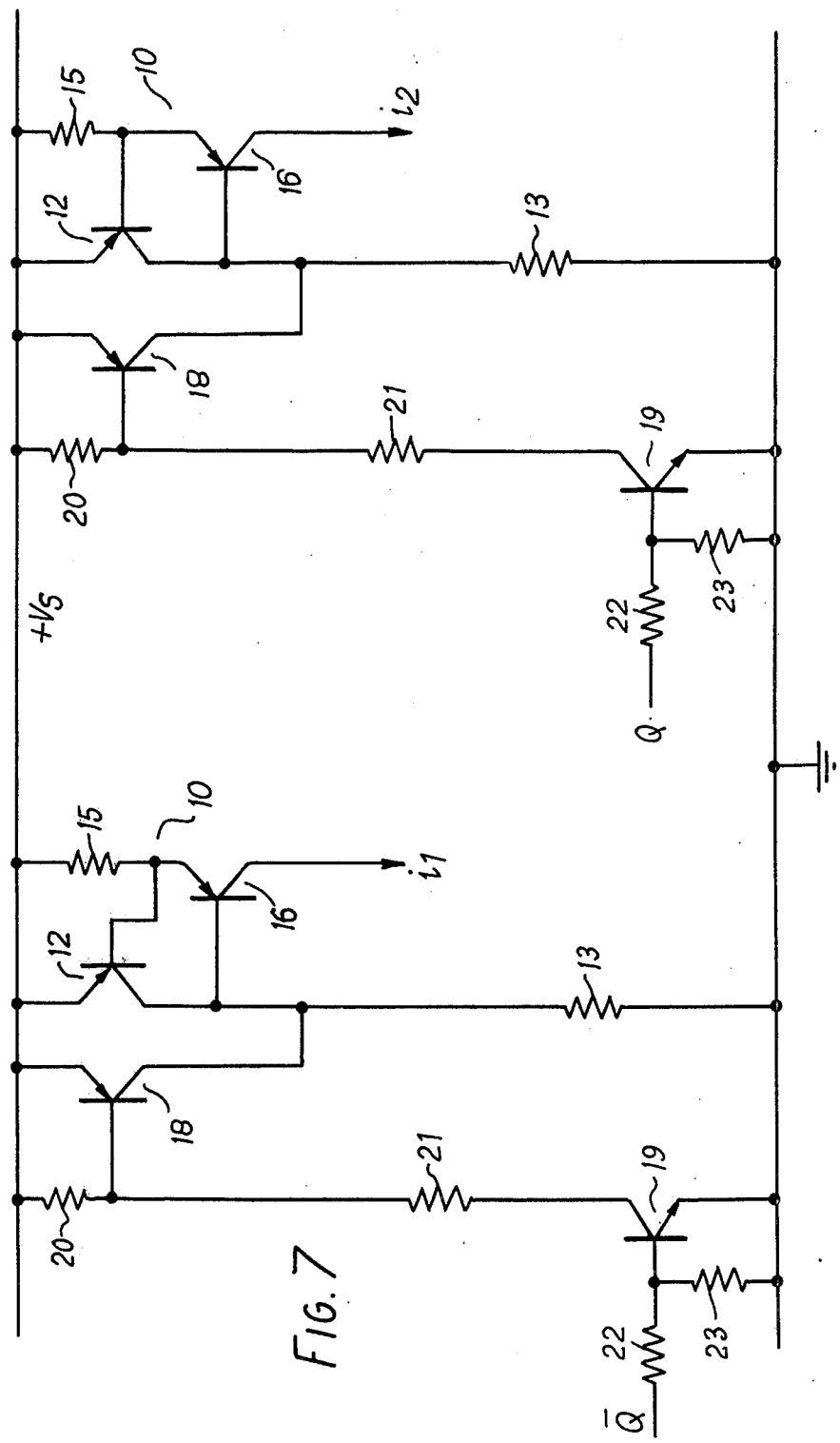

It is necessary to arrange that the first, and only the first, array is supplied with current whilst the first analogue input is present at the input terminal, similarly with the second array. Two methods of achieving this end are illustrated in FIGS. 7 and 8 respectively. In FIG. 7 each array has its own current source, generally indicated by 10. This consists of two PNP transistors 12 and 16 connected in a similar manner as those illustrated in FIG. 6. The collector of transistor 12 is, however, connected through resistor 13 to earth rather than to a battery. Two PNP transistors 18 each have their emitters connected to the positive supply, their collectors connected to respective collectors of transistors 12, and their bases connected to the positive supply rail through respective resistors 20 as well as to the collectors of respective NPN transistors 19 through respective resistors 21. The emitters of transistors 19 are taken to earth and their bases are connected through respective resistors 22 to outputs of D-type bistable flip-flop 7 and through respective resistors 23 to earth. The action of the first current source is inhibited by the presence of output $\bar{Q}$ of D-type bistable flip-flop and that of the second source by output Q. The result is that only one of the currents $i_1$ and $i_2$ is supplied at any time, $i_1$ being supplied when analogue input i/p 1 is present at the input terminal. The advantage of this arrangement is that the magnitudes of $i_1$ and $i_2$ can be preset independently. Thus if one array consisted of LED's emitting green light and the other array red, the two currents could be adjusted to equalize the apparent brightness of the two arrays.

The circuit of FIG. 8 comprises a source of direct constant current connected between the positive supply rail and a terminal 25. Two identical networks are connected between this terminal and the respective diode arrays. Each network comprises a NPN transistor 26 having its emitter connected to the terminal 25, its collector connected to the collector of a PNP transistor 27 and its base connected to the terminal 25 through a resistor 28 as well as to the emitter of transistor 27. The base of transistor 27 is connected to the terminal 25 through a resistor 29 and to the collector of a NPN transistor 31 through a resistor 30. The emitter of transistor 31 is taken to earth and the base is connected to an output of D-type bistable flip-flop 7 through resistor 32 as well as to earth through resistor 33. The anode of the uppermost LED of the corresponding array is connected to the junction of the collectors of transistors 26 and 27.

This circuit functions in such a manner that the output I of the source is switched from one array to the other under the control of the signals Q and $\bar{Q}$ from the D-type bistable flip-flop.

If more than two analogue inputs are to be multiplexed, further arrays of LED's and additional transmission gates will be required. The "divide-by-two" counter will need to be expanded to whatever count is necessary and will require a decoder of the type known as "1-out-of-N" on its output so that only one transmission gate and only one current path are energised at any time.

It will be realized that the invention is not restricted to the use of linear columns of LED's which has been described in detail. A great many different display effects can be achieved by the use of different colors, quantities or layouts of LED's. As examples, the array might be a circular ring, a rectangular field or a spherical volume.

The above discussion has been devoted to the display applications of the invention. An alternative application stems from the capability of circuits such as that depicted in FIG. 2 to control external circuits without the need for electrical contact.

As an example, the light from the LED's can be used to operate photo transistors 35, as shown in FIG. 2. Each phototransistor suitably controls a triac supplying power to a lamp. In this way the optical intensity of the original LED display can be magnified many times to provide displays which can be read from large distances.

As a second example, a single phototransistor is operated by an LED such as $L_\beta$ of FIG. 3. In this manner a signal will be obtained from the phototransistor whenever the parameter represented by the analogue input strays outside predetermined tolerance limits. This signal can be used to bring the parameter back to its correct value or to operate audible and other warning systems.

Radiation emitting diodes which emit in regions outside the visible portion of the spectrum are well known and have some useful applications. Common examples are infra-red emitting diodes and Gunn diodes. These diodes can usefully be employed in circuits according to the invention and although the invention has been described with reference to light emitting diodes, it is not intended to be limited to them.

What I claim is:

1. Electrical circuit means comprising a plurality of radiation emitting diodes connected in electrical relationship for the passage of electrical current successively therethrough, means for connecting the radiation emitting diodes in series with a source of direct constant current, current diverting paths respectively connected with the radiation emitting diodes, a semiconductor device disposed in each current diverting path, means for applying a control voltage in the form of an analogue input voltage to the semiconductor devices, and means independent of the radiation emitting diodes for biasing each semiconductor device to effect conduction of the current diverting path associated therewith at a predetermined level of the analogue input voltage, the said predetermined level being unique to each path and increasing successively from one to the next path.

2. Electrical circuit means as claimed in claim 1 wherein the semiconductor device, the means for applying an analogue input voltage to the semiconductor devices and the means for biassing each semiconductor device are so chosen or adapted that at any value of the analogue input voltage no more than two of the current diverting paths are conducting a significant current.

3. Electrical circuit means as claimed in claim 1 wherein the semiconductor device, the means for applying an analogue input voltage to the semiconductor devices and the means for biassing each semiconductor device are so chosen or adapted that at certain values of the analogue input voltage three or more of the current diverting paths are conducting a significant current.

4. Electrical circuit means as claimed in claim 1 wherein respective additional radiation emitting diodes are disposed in one or more of the current diverting paths.

5. Electrical circuit means comprising a plurality of arrays of radiation emitting diodes, the diodes of each array being connected in electrical relationship for the passage of electrical current successively therethrough, means for connecting the arrays each in series with a source of direct constant current, current diverting paths respectively connected with each set of radiation emitting diodes said set being formed by corresponding diodes of the arrays, a semiconductor device disposed in each current diverting path, means for applying in turn analogue input voltages corresponding in number to the number of diode arrays to the semiconductor devices, means independent of the radiation emitting diodes for biasing each semiconductor device to effect conduction of the current diverting path associated therewith at a predetermined level of the analogue input voltages, said predetermined level being unique to each path and increasing successively from one to the next path, and means for energizing the diode arrays in turn from a source of direct constant current in synchronism with the application of the analogue voltage inputs to the semiconductor devices.

6. Electrical circuit means as claimed in claim 5 wherein the means for applying analogue input voltages comprise a plurality of input terminals each adapted to receive one of the analogue input voltages, switch means serving to connect said terminals to a common terminal in turn and means for connecting the common terminal to the semiconductor devices.

7. Electrical circuit means as claimed in claim 5 wherein the means for energizing the radiation emitting diode arrays in turn comprise a plurality of sources of direct constant current, there being one source for each array, and means for enabling in turn a connection between each source and its associated array.

8. Electrical circuit means as claimed in claim 5 wherein the means for energizing the radiation emitting diode arrays comprise a single source of direct constant current and means for enabling in turn a connection between the source and each of the arrays.

9. Electrical circuit means comprising electrical circuit means as claimed in claim 1 wherein one or more external circuits are provided each having a semiconductor device which is adapted to be controlled by the absorption of radiation emitted from one of said radiation emitting diodes.

10. Electrical circuit means as claimed in claim 1 wherein the means for connecting the radiation emitting diodes in series with a source of direct constant current comprise means for chopping the direct current derived from the source.

11. Electrical circuit means comprising a chain of radiation emitting diodes connected in series; means for connecting a source of direct constant current in series with said chain; current diverting paths respectively connected with the radiation emitting diodes for diverting current from said chain; a semiconductor device disposed in each current diverting path for controlling the conduction thereof; means for applying an analogue input voltage to the semiconductor devices and reference voltage means for applying a unique reference voltage to each semiconductor device whereby conduction of each current diverting path is effected at a predetermined level of the analogue input voltage, the predetermined level being unique to that path and increasing successively from one to the next path so that in operation of the electrical circuit means current may be diverted successively from radiation emitting diodes of the chain.

12. Electrical circuit means as claimed in claim 11 wherein said ratiation emitting diodes comprise light emitting diodes.

13. Electrical circuit means as claimed in claim 12, wherein said reference voltage means comprise a plurality of semiconductor elements each having two terminals and each being connected between the semiconductor devices associated with successive current diverting paths.

14. Electrical circuit means as claimed in claim 13, wherein each semiconductor device comprises a transistor having its collector connected to one side of the associated light emitting diode and its emitter connected to the appropriate terminal of one of said semiconductor elements, the analogue input voltage being applied to the base of each transistor.

* * * * *